United States Patent [19]

Blauschild

[11] 4,390,848

[45] Jun. 28, 1983

[54] LINEAR TRANSCONDUCTANCE AMPLIFIER

[75] Inventor: Robert A. Blauschild, Los Altos, Calif.

[73] Assignee: Signetics, Sunnyvale, Calif.

[21] Appl. No.: 233,911

[22] Filed: Feb. 12, 1981

[51] Int. Cl.³ ............................ H03F 1/02; H03F 3/45
[52] U.S. Cl. .................................... 330/151; 330/252; 330/254; 330/261
[58] Field of Search ............... 330/149, 151, 252, 254, 330/258, 261

[56] References Cited

U.S. PATENT DOCUMENTS 4,267,516  5/1981  Traa .................................... 330/252

Primary Examiner—James B. Mullins
Assistant Examiner—Gene Wan
Attorney, Agent, or Firm—Thomas A. Briody; Robert T. Mayer; Steven R. Biren

[57] ABSTRACT

A linear transconductance amplifier includes a differential transconductance amplifier stage and a differential correction amplifier stage. In order to achieve linear operation over a wide dynamic range, the nonlinearities generated in the transconductance amplifier stage are substantially cancelled by the nonlinearities generated in the correction amplifier stage. This is accomplished by cross-coupling the two stages and establishing the relative gain of the correction amplifier stage with respect to the transconductance amplifier stage such that the desired cancellation occurs. In a preferred embodiment, optimum cancellation occurs when the gain of the correction amplifier stage is substantially one-half the gain of the transconductance amplifier stage.

15 Claims, 6 Drawing Figures

LINEAR TRANSCONDUCTANCE AMPLIFIER

BACKGROUND OF THE INVENTION

This invention is in the field of transistorized amplifier circuits, and relates more specifically to linear transconductance amplifier circuits.

The basic concept of using a differential correction amplifier to provide a correction signal to a main amplifier is shown in U.S. Pat. No. 4,146,844. In the circuit disclosed in FIG. 4 of that patent, there is shown an amplifier circuit having a correction amplifier which takes its input from the collectors of the two inputs transistors of the main amplifier. This circuit, however, is relatively complex. Furthermore, since the correction amplifier does not see the same signal as the main amplifier, cancellation of nonlinearities is not optimum, and transconductance will be dependent upon base-emitter voltage ($V_{be}$) and transistor current gain ($\alpha$). The correction amplifier used in FIG. 4 of U.S. Pat. No. 4,146,844 is of the type having two transistors (100, 102) with their emitters connected together by a single resistor (105), and a current source (110, 108) from each emitter to a source of reference voltage.

In U.S. Pat. No. 4,048,577, FIG. 5a shows one form of a gain cell circuit used to provide improved bandwidth. This circuit utilizes a compensation amplifier of the type in which the emitters of the two transistors forming the differential compensation amplifier are connected together by two resistors (21, 23) in series, with a current source being connected from their common junction to a source of reference potential.

While the circuits of the invention bear certain superficial similarities to portions of the configurations described above, none of the known prior art configurations combine these circuits in the manner disclosed herein or provide the necessary relative gain ratios to obtain a simple configuration in which low distortion is combined with linear operation over a wide dynamic range.

SUMMARY OF THE INVENTION

It is therefore an object of the present invention to provide a linear transconductance amplifier which is simple in configuration, and yet which is capable of providing substantially linear operation, even for large signal input levels.

In accordance with the invention, this object is accomplished by a new linear transconductance amplifier in which nonlinearities generated in a differential transconductance amplifier stage are substantially cancelled by nonlinearities which are intentionally generated in a differential correction amplifier stage. By appropriately establishing the relative gain of the correction amplifier stage with respect to the transconductance amplifier stage, the nonlinearities generated in the transconductance amplifier stage can be substantially cancelled by the nonlinearities generated in the correction amplifier stage.

The differential transconductance amplifier stage includes two bipolar transistors, with their base zones forming the differential voltage input terminals of the transconductance amplifier, and their collector zones forming the differential current output terminals of the transconductance amplifier. The differential correction amplifier stage has its input terminals connected to the emitter zones of the differential transconductance amplifier stage transistors, while its output terminals are cross-coupled to the collector zones of these same transistors.

In a preferred embodiment of the invention, the differential correction amplifier stage is formed by two further bipolar transistors, whose base zones are connected to the emitter zones of the two differential transconductance amplifier stage transistors, and whose collector zones are cross-coupled to the collector zones of the differential transconductance amplifier stage transistors. Within this basic configuration, several variations in circuit format for the transconductance and correction amplifier stages are possible. The common feature of each is that the relative gain of the correction amplifier stage with respect to the transconductance amplifier stage is established such that the nonlinearities generated in the transconductance amplifier stage are substantially cancelled by the nonlinearities generated in the correction amplifier stage. In a preferred embodiment of the invention, the gain of the transconductance amplifier stage is selected to be substantially twice the gain of the correction amplifier stage for optimum cancellation of nonlinearities.

In the present invention, the inputs to the differential correction amplifier stage are always taken directly from the emitters of the differential transconductance amplifier stage transistors, thus rendering the circuit insensitive to current gain and insuring optimum cancellation of nonlinearities due to variations in $V_{be}$ and beta. When this configuration is used in combination with an appropriate relative gain selection for the two amplifier stages, the result is a simple and yet high-performance linear transconductance amplifier which represents a substantial improvement over previous designs.

The invention may be more completely understood with reference to the following detailed description, to be read in conjunction with the accompanying drawing, in which like components are designated by like reference numerals for simplicity.

DETAILED DESCRIPTION

Figure 1:
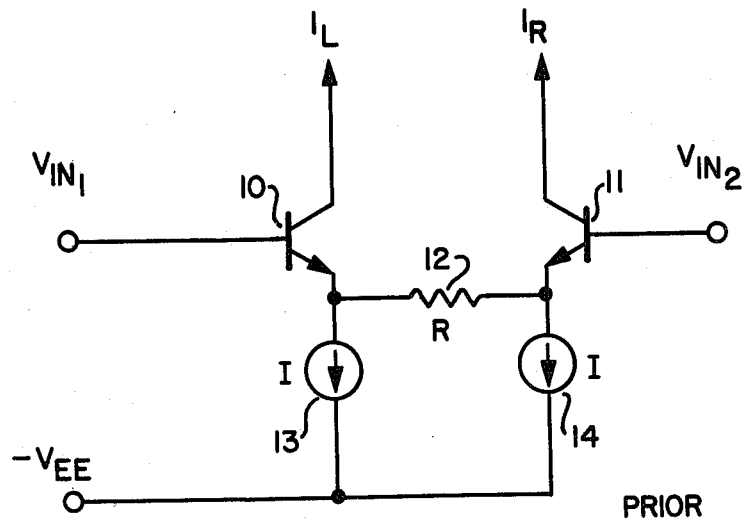
FIGS. 1 and 2 are schematic diagrams of linear transconductance amplifiers as known in the prior art.

A simple transconductance amplifier of conventional design is shown in the schematic diagram of FIG. 1. In this circuit, bipolar transistors 10 and 11 are connected in a differential configuration with their emitter zones connected by a resistor 12. A differential input ($V_{IN1} - V_{IN2}$) is applied to the base zones of transistors 10 and 11, and a differential current output ($I_L - I_R$) is taken from the two collector zones as shown. Current sources 13 and 14 are connected from the emitter zones of transistors 10 and 11, respectively, to a common terminal, in this case a reference voltage of $-V_{EE}$.

Figure 2:
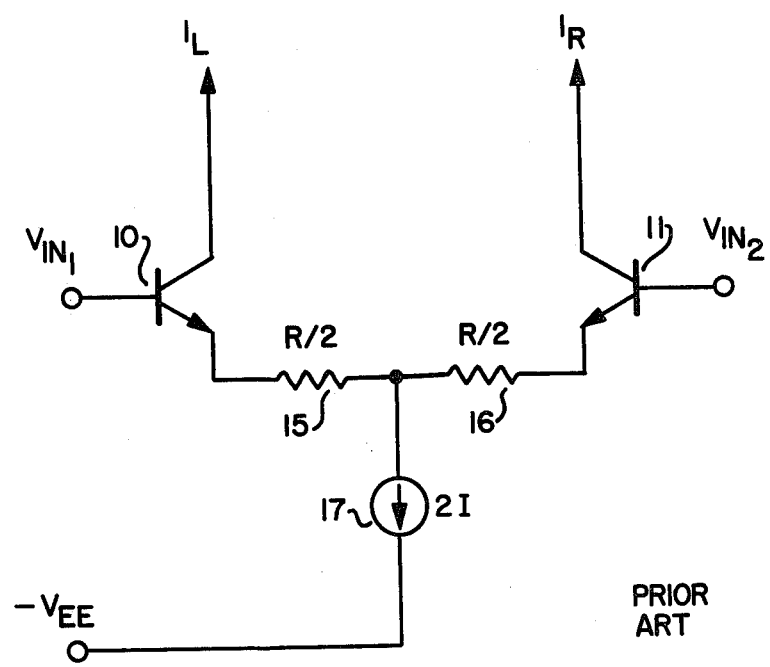

The circuit of FIG. 2 shows another known transconductance amplifier circuit which is similar to the circuit of FIG. 1 with the exception of the emitter coupling arrangement. In FIG. 2, series-connected resistors 15 and 16, of like value, are connected between the emitter zones of transistors 10 and 11, and a current source 17 is connected from the common junction between resistors 15 and 16, and the common terminal at a voltage of $-V_{EE}$. In other respects, the circuits of FIGS. 1 and 2 are identical.

These known transconductance amplifiers circuits are simple and compact, and capable of high-speed operation, but their performance is adversely effected by variations in temperature, current gain, and $V_{be}$. Furthermore, the circuits of FIGS. 1 and 2 are suitable only for small-signal operation, as linearity is poor for higher input levels. Although performance of these circuits can be improved by increasing either bias current or emitter resistance, the former solution has the disadvantage of higher power consumption, while the latter causes an undesirable increase in noise.

In accordance with the invention, as shown in various embodiments in FIGS. 3-6, the advantages of the known amplifier circuits are maintained, while linearity and large-signal performance are substantially improved. These improvements are obtained by providing a linear transconductance amplifier having a differential transconductance amplifier stage with a differential correction amplifier stage. The differential correction amplifier stage is connected to the differential transconductance amplifier stage in such a manner that a correction signal proportional to the transconductance amplifier stage nonlinearity is generated in the correction amplifier stage, and this signal is subtracted from the output of the transconductance amplifier stage to achieve a substantially linear output. By appropriately adjusting the relative gain of the correction amplifier stage with respect to the transconductance amplifier stage, nonlinearities generated in the latter are substantially cancelled by the nonlinearities generated in the former, even for high input levels.

The concept of the invention can be embodied in various forms, as illustrated by the circuits shown in FIGS. 3-6 of the drawing. The linear transconductance amplifier shown in FIG. 3, for example, includes a differential transconductance amplifier stage of the type shown in FIG. 1, with corresponding components being designated by corresponding reference numerals for clarity. This differential transconductance amplifier stage is coupled to a differential correction amplifier stage composed of transistors 18 and 19, resistors 20 and 21, and current source 22. This differential correction amplifier stage has a circuit configuration similar to that of the transconductance amplifier of FIG. 2, but in this circuit it is used as an auxiliary correction amplifier stage in combination with the differential transconductance amplifier stage described above. In accordance with the invention, the inputs to the correction amplifier stage, at the base zones of transistors 18 and 19, are connected to the emitter zones of transistors 10 and 11 of the transconductance amplifier stage, respectively, so that the correction amplifier stage sees the same differential input signal as the transconductance amplifier stage, less the $V_{be}$ drops of transistors 10 and 11. By having both amplifier stages receive essentially the same input signal, optimum cancellation of nonlinearities is obtained for maximum performance. In order to subtract the appropriate correction signals from the output of the transconductance amplifier stage, the outputs of the correction amplifier stage, at the collector zones of transistors 18 and 19, are cross-coupled to the collector zones of transistors 11 and 10, respectively, at the circuit output terminals.

In order to insure optimum cancellation of nonlinearities generated in the transconductance amplifier stage by the correction amplifier stage, in accordance with the invention, it is necessary to appropriately establish the relative gain of the correction amplifier stage with respect to the gain of the transconductance amplifier stage. This is accomplished by assigning appropriate values for the emitter resistors and current sources for the transconductance amplifier stage (12, 13, and 14) and for the correction amplifier stage (20, 21, and 22). It has been determined by theoretical calculation, and confirmed by experimental data, that optimum cancellation of nonlinearity is obtained when the gain of the transconductance amplifier is substantially twice the gain of the correction amplifier stage. This relative gain is established in the circuit of FIG. 3 and subsequent Figures by the indicated values of relative resistance in terms of multiples and submultiples of a value R, and for relative current source values in terms of multiples and submultiples of a current value I. It should be noted that the current sources shown in the Figures are of a conventional type, known to those skilled in the art.

Figure 3:
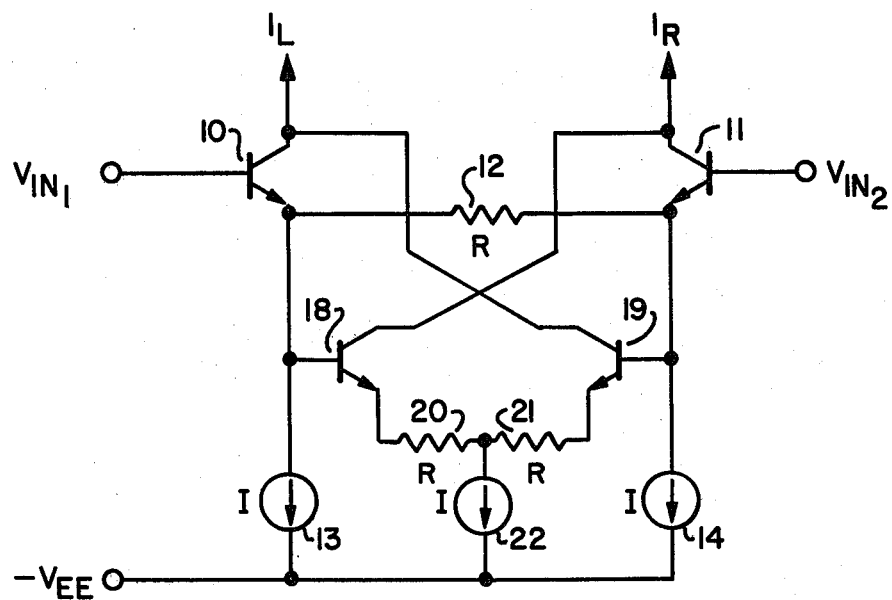
FIGS. 3-6 are schematic diagrams of linear transconductance amplifiers in accordance with the invention.
Figure 4:
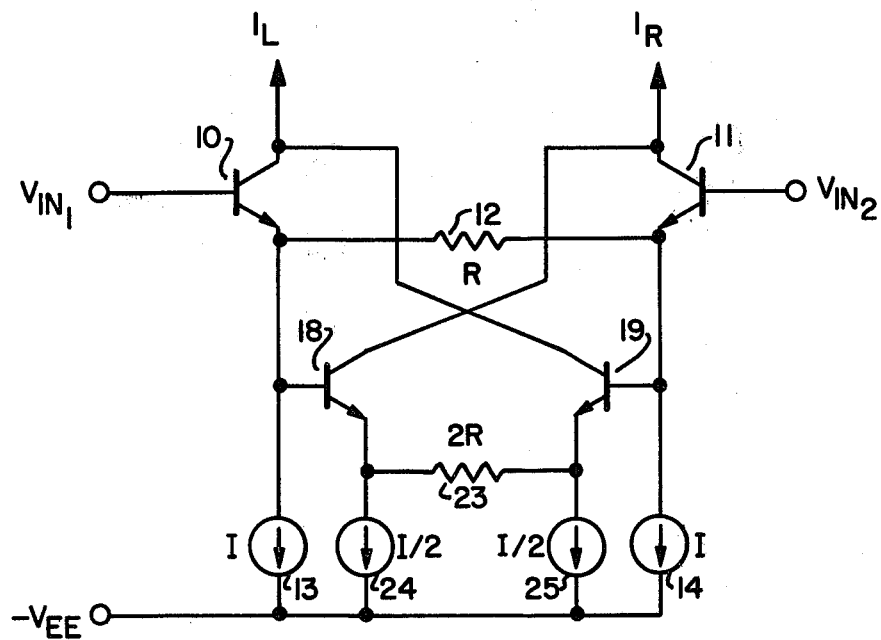
Figure 5:
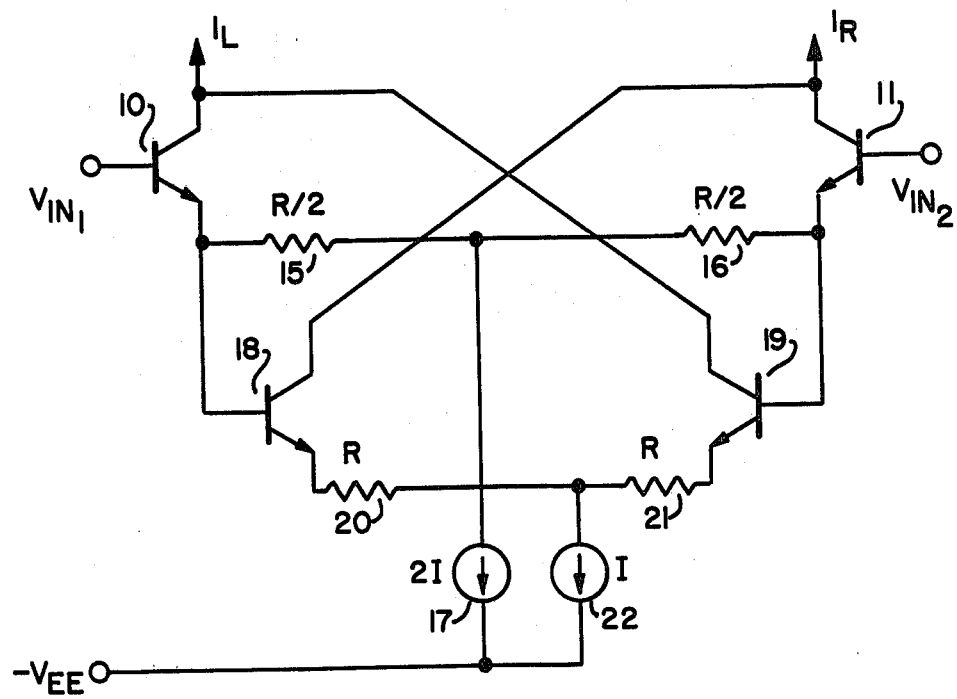
Figure 6:
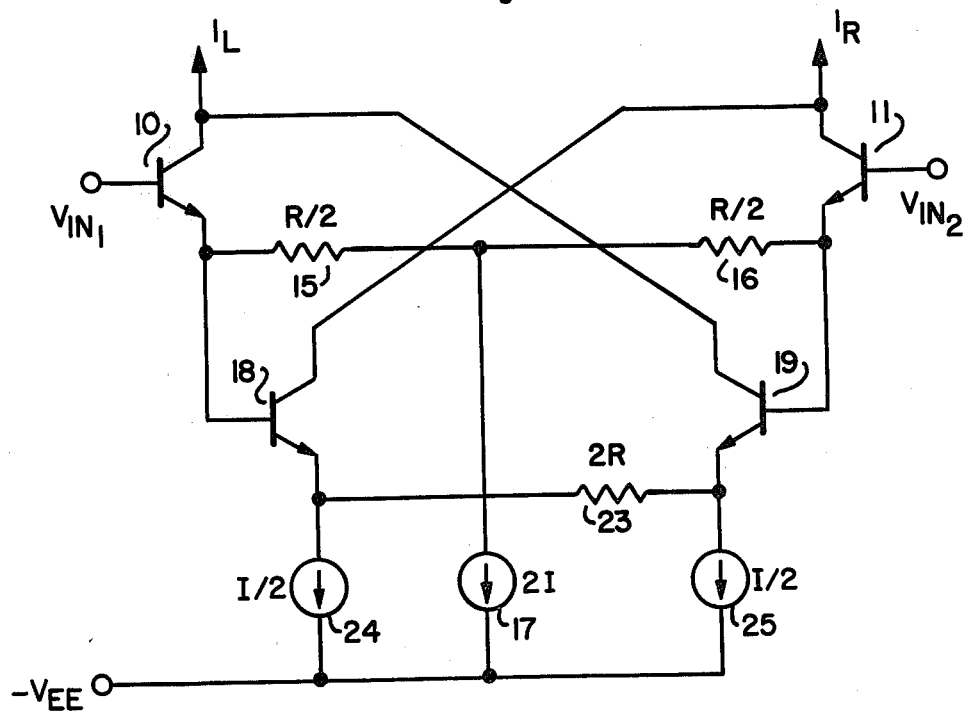

In the remaining Figures, three alternative embodiments of the basic concept shown in FIG. 3 are illustrated, with like components being designated with like reference numerals for clarity. In FIG. 4, a transconductance amplifier stage of the type shown in FIG. 1 is combined with a correction amplifier stage of like configuration, having a single emitter resistor 23 and a pair current sources 24 and 25. Similarly, in FIG. 5, a transconductance amplifier stage of the type shown in FIG. 2 is combined with a correction amplifier stage of like configuration, while in FIG. 6, a transconductance amplifier stage of the type shown in FIG. 2 is combined with a correction amplifier stage of the type shown in FIG. 1.

All of the configurations shown in FIGS. 3-6 employ the same basic concept, namely the cross-coupling of an appropriately-connected amplifier stage to a transconductance amplifier stage with appropriate selection of the relative gains of the two stages by choosing suitable values for the emitter resistors and current sources of the circuits. However, the various configurations offer different secondary advantages in combination with the primary feature of improved linearity over a wide range of input signals.

For example, the circuit of FIG. 4 yields the lowest offset as well as the highest common mode range, since the bias currents do not flow through the emitter resistors 12 and 23. On the other hand, the circuit of FIG. 5 exhibits the lowest noise level, since the noise of the current sources 17 and 22 appears only as a common mode signal. The circuits of FIG. 3 and FIG. 6, each having three current sources, offer a performance compromise between the circuits of FIG. 4 and FIG. 5. Thus, the selection of a particular circuit embodiment of the invention can be made after a determination of which performance factors in addition to improved linearity and dynamic range are desired.

The differential current outputs $(I_L - I_R)$ from the linear transconductance amplifiers of FIGS. 3-6 may be used in a number of advantageous configurations. Thus, for example, the two output terminals at the collectors of transistors 10 and 11 can be coupled to the inputs of a pair of current mirrors of conventional design, with a differential current output appearing across the output terminals of the current mirrors. Alternatively, the two output terminals of the circuits illustrated may be connected to a pair of resistors, in order to obtain a differential output voltage signal. Yet another application of the present invention involves connecting the current output terminals to a capacitive load in order to form a linear ramp generator. The excellent linearity and wide dynamic range of the disclosed circuits make them particularly suited for these and many other applications, including in particular open-loop high gain-bandwidth amplifiers.

While the invention has been particularly shown and described with reference to certain preferred embodiments, it will be understood by those skilled in the art that various changes in form and detail, such as the substitution of pnp transistors for the npn transistors shown, may be made without departing from the spirit and scope of the invention.

I claim:

1. A self-biasing linear transconductance amplifier, which comprises:
   a differential transconductance amplifier stage having a first bipolar transistor with first emitter, base and collector zones and a second bipolar transistor with second emitter, base and collector zones, said first and second base zones comprising the differential voltage input terminals of said linear transconductance amplifier and said first and second collector zones comprising the differential current output terminals of said linear transconductance amplifier;
   a differential correction amplifier stage having first and second input terminals and first and second output terminals, said first and second input terminals being directly connected, respectively, to said first and second emitter zones of said first and second bipolar transistors and said first and second output terminals being connected, respectively, to said second and first collector zones of said second and first bipolar transistors; and
   means for establishing the relative gain of said correction amplifier stage with respect to the gain of said transconductance amplifier stage such that the nonlinearities generated in such transconductance amplifier stage are substantially cancelled by the nonlinearities generated in said correction amplifier stage.

2. A linear transconductance amplifier as in claim 1, further comprising a first resistive element connected between said first and second emitter zones in said transconductance amplifier stage, and a second resistive element connected to said correction amplifier stage, said means for establishing the relative gain of said correction amplifier stage comprising said first and second resistive elements.

3. A linear transconductance amplifier as in claim 2, wherein said differential correction amplifier stage further comprises a third bipolar transistor having third emitter, base and collector zones and a fourth bipolar transistor having fourth emitter, base and collector zones, said third and fourth base zones being connected, respectively, to said first and second emitter zones, said third and fourth collector zones being connected, respectively, to said second and first collector zones, and said third and fourth emitter zones being connected to said second resistive element.

4. A linear transconductance amplifier as in claim 3, wherein said transconductance amplifier stage further comprises a first current source connected from said first emitter zone to a common terminal and a second current source connected from said second emitter zone to said common terminal, and said first resistive element comprises a first resistor.

5. A linear transconductance amplifier as in claim 4, wherein said correction amplifier stage further comprises a third current source, said second resistive element comprises second and third resistors of like value connected in series between said third and fourth emitter zones and forming a first common junction therebetween, and said third current source is connected between said first common junction and the common terminal, said means for establishing the relative gain of said correction amplifier stage comprising said first, second and third resistors and said first, second and third current sources.

6. A linear transconductance amplifier as in claim 5, wherein said first, second and third current sources are of like current value and said first, second and third resistors are of like resistance value.

7. A linear transconductance amplifier as in claim 4, wherein said correction amplifier further comprises a fourth current source connected from said third emitter zone to the common terminal and a fifth current source connected from said fourth emitter zone to the common terminal, said second resistive element comprises a fourth resistor connected between said third and fourth emitter zones, and said means for establishing the relative gain of said correction amplifier stage comprises said first and fourth resistors and said first, second, fourth and fifth current sources.

8. A linear transconductance amplifier as in claim 7, wherein said first and second current sources are twice the value of said fourth and fifth current sources, and said fourth resistor is twice the value of said first resistor.

9. A linear transconductance amplifier as in claim 3, wherein said linear transconductance amplifier stage further comprises a sixth current source, said first resistive element comprises fifth and sixth resistors of like value connected in series between said first and second emitter zones and forming a second common junction therebetween, and said sixth current source is connected between said second common junction and the common terminal.

10. A linear transconductance amplifier as in claim 9, wherein said correction amplifier stage further comprises said third current source, said second resistive element comprises said second and third resistors of like value connected in series between said third and fourth emitter zones and forming said first common junction therebetween, and said third current source is connected between said first common junction and the common terminal, said means for establishing the relative gain of said correction amplifier stage comprising said second, third, fifth and sixth resistors and said third and sixth current sources.

11. A linear transconductance amplifier as in claim 10, wherein said sixth current source is substantially twice the current value of said third current source and said second and third resistors are each twice the resistance value of each of said fifth and sixth resistors.

12. A linear transconductance amplifier as in claim 9, wherein said correction amplifier further comprises said fourth current source connected from said third emitter zone to the common terminal and said fifth current source connected from said fourth emitter zone to the common terminal, said second resistive element comprises said fourth resistor connected between said third and fourth emitter zones, and said means for establishing the relative gain of said correction amplifier stage comprises said fourth, fifth and sixth resistors and said fourth, fifth and sixth current sources.

13. A linear transconductance amplifier as in claim 12, wherein said sixth current source is substantially four times the current value of each of said fourth and fifth current sources, and said fourth resistor is substantially four times the resistance value of each of said fifth and sixth resistors.

14. A linear transconductance amplifier as in claim 6, 8, 11 or 13, wherein said first through fourth bipolar transistors are all of the same type.

15. A linear transconductance amplifier as claimed in claim 1, wherein the gain of said transconductance amplifier stage is substantially twice the gain of said correction amplifier stage.

* * * * *